US008232216B2

(12) United States Patent
Baba et al.

(10) Patent No.: US 8,232,216 B2
(45) Date of Patent: Jul. 31, 2012

(54) SEMICONDUCTOR MANUFACTURING APPARATUS AND METHOD FOR MANUFACTURING A SEMICONDUCTOR

(75) Inventors: Hiroyuki Baba, Miyazaki (JP); Tomoyasu Kai, Miyazaki (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 196 days.

(21) Appl. No.: 12/801,420

(22) Filed: Jun. 8, 2010

(65) Prior Publication Data
US 2010/0323528 A1  Dec. 23, 2010

(30) Foreign Application Priority Data
Jun. 18, 2009 (JP) ................. 2009-144813

(51) Int. Cl.
H01L 21/31 (2006.01)
C23C 16/00 (2006.01)

(52) U.S. Cl. ........ 438/758; 438/781; 438/782; 118/729
(58) Field of Classification Search .................. 438/758, 438/781, 782; 118/729
See application file for complete search history.

(56) References Cited

U.S. PATENT DOCUMENTS
2001/0037764 A1* 11/2001 Nakashima et al. ............ 118/70
2005/0051102 A1*  3/2005 Sato et al. ...................... 118/729

FOREIGN PATENT DOCUMENTS
JP        2006-028577 A      2/2006
* cited by examiner Primary Examiner — Thanh V Pham
(74) Attorney, Agent, or Firm — Rabin & Berdo, P.C.

(57) ABSTRACT

Provided are a semiconductor manufacturing apparatus and method, capable of reliably and rapidly transporting a heated semiconductor wafer. the apparatus is provided for transporting a semiconductor wafer, which has been processed by desired treatment (for example, film formation) and is held by a susceptor equipped with a heater, to the outside by a transport arm which holds the semiconductor wafer by suction, by moving the susceptor to a certain position above a top of a wafer waiting stage and introducing the semiconductor wafer held by the susceptor onto the top of the wafer waiting stage. Then, the susceptor present on the top of the wafer waiting stage is moved in a horizontal direction. After a certain cooling time, the transport arm holds the semiconductor wafer placed on the wafer waiting stage by suction and transports the semiconductor wafer to outside.

8 Claims, 9 Drawing Sheets

[PHASE C]

[PHASE D]

SEMICONDUCTOR MANUFACTURING APPARATUS AND METHOD FOR MANUFACTURING A SEMICONDUCTOR

BACKGROUND OF THE INVENTION

1. Technical Field

The present invention relates to a semiconductor manufacturing apparatus and a method for manufacturing the semiconductor for forming a thin film in the surface of a semiconductor wafer.

2. Background Art

At present, a chemical vapor deposition (CVD) technique is well known as a process for forming a thin film on a semiconductor wafer.

With regard to a semiconductor manufacturing equipment using CVD techniques, a CVD apparatus for forming a thin film on a surface of a semiconductor wafer has been proposed (see Japanese Patent Application Kokai No. 2006-28577). The semiconductor wafer placed on a wafer stage is transported into a reactor. In the reactor, a reactive gas flows over the surface of the semiconductor heated by a heater. After film formation as described above, the treated semiconductor wafer is removed from the wafer stage and delivered to a collection tray, using a wafer transport device.

SUMMARY OF THE INVENTION

Since a semiconductor wafer processed by film formation is hot, the wafer is sometimes deformed due to heat. When a wafer transport device which grips the semiconductor wafer by vacuum contact deliver a treated semiconductor wafer, heat deformation leads to difficulties in suction (or adsorption) of the semiconductor wafer, thus causing problems in smooth and reliable transportation thereof.

The present invention is directed to solving the foregoing problems and an object of the present invention is to provide an apparatus and a method for manufacturing semiconductors, capable of rapidly and reliably delivering heated semiconductor wafers.

In order to accomplish the above purpose, the present invention provides a semiconductor manufacturing apparatus for holding a semiconductor wafer by suction and transporting the semiconductor wafer outside, the semiconductor wafer has been processed by desired treatment while heating, comprising: a susceptor for heating the semiconductor wafer while holding the semiconductor wafer; a wafer waiting stage placed at a position below the susceptor; a moving device for moving the susceptor in a horizontal direction between a first position above the wafer waiting stage and a second position different from the first position; a transport arm equipped with a suction part; and a control part for executing: a first step of controlling the moving device to move the susceptor to the first position after completing the desired treatment; a second step for controlling the susceptor so as to allow the semiconductor wafer to move to the wafer waiting stage by separating the semiconductor wafer from therefrom; a third step of controlling the moving device so as to move the susceptor to the second position; and a fourth step of controlling the transport arm so as to hold the semiconductor wafer at the suction part by suction and transport the semiconductor wafer on the wafer waiting stage to outside after a certain cooling period from the end of the third step.

In addition, the present invention provides a method for manufacturing the semiconductor for holding a semiconductor wafer by suction and transporting the semiconductor wafer to outside, the semiconductor wafer has been processed by desired treatment while heating, comprising: a first step of moving a susceptor to a first position above a wafer waiting stage after completing the desired treatment, wherein the susceptor heats the semiconductor wafer while holding the semiconductor wafer; a second step of separating the semiconductor wafer from the susceptor so as to allow the semiconductor wafer to move to the wafer waiting stage; a third step of moving the susceptor in a horizontal direction from the first position to a second position different from the first position; and a fourth step of holding the semiconductor wafer placed on the wafer waiting stage to a transport arm and transporting the semiconductor wafer outside by the transport arm after a certain cooling period from the end of the third step.

According to the present invention, with regard to transportation of a semiconductor wafer to the outside by a transport arm which holds the semiconductor wafer by suction, after the semiconductor has been treated by a film formation process, the high temperature semiconductor wafer after film formation is subjected to natural cooling for a certain period of time before suction. As a result, failure to suction the semiconductor wafer cause by thermal deformation thereof may be inhibited and the semiconductor wafer may be desirably transported outside. With regard to the natural cooling of the semiconductor wafer, a susceptor equipped with a heater located on a top of the semiconductor wafer moves in a horizontal direction, thus reducing an amount of radiant heat which was emitted from a surface of the susceptor and directly irradiated the semiconductor wafer. As a result, the cooling time is decreased, and the heated semiconductor wafer may be suitably and rapidly transported outside.

DETAILED DESCRIPTION OF THE INVENTION

With respect to a semiconductor manufacturing apparatus according to the present invention, the apparatus is provided for transporting a semiconductor wafer, which has been processed by desired treatment (for example, film formation) and is held by a susceptor equipped with a heater, to the outside by a transport arm which holds the semiconductor wafer by suction, by moving the susceptor to a certain position above a top of a wafer waiting stage and introducing the semiconductor wafer held by the susceptor onto the top of the wafer waiting stage. Then, the susceptor present on the top of the wafer waiting stage is moved in a horizontal direction and, after a certain cooling time, holds the semiconductor wafer placed on the wafer waiting stage by suction of a transport arm which in turn transports the semiconductor wafer to outside.

Figure 1:
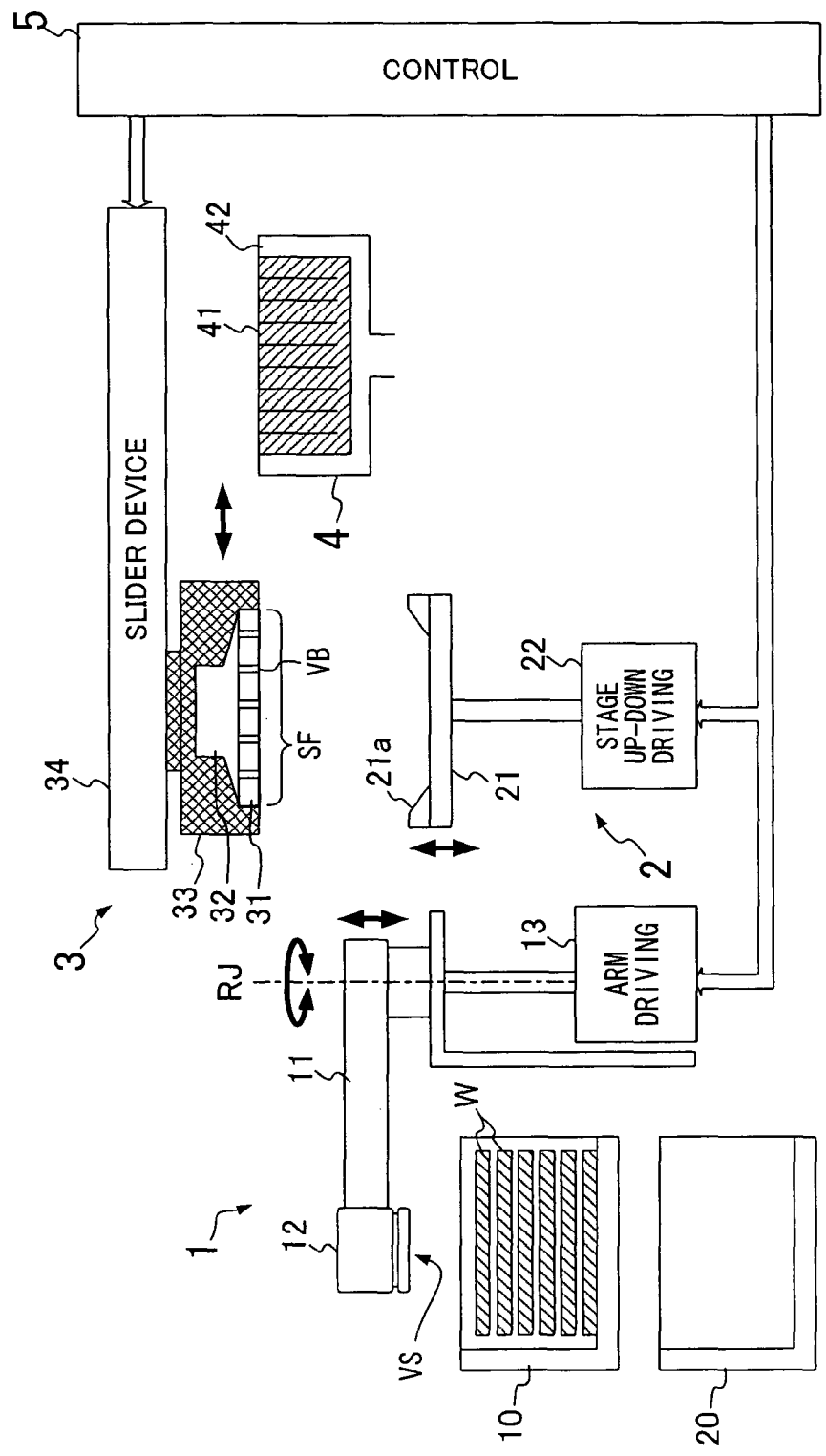
FIG. 1 illustrates a configuration of a semiconductor manufacturing apparatus according to the present invention.

FIG. 1 illustrates an embodiment of a configuration of a semiconductor manufacturing apparatus according to the present invention.

As shown in FIG. 1, the semiconductor manufacturing apparatus includes a first transport part 1, a second transport part 2, a third transport part 3, a dispersion head 4 and a control part 5. As shown in FIG. 1, the foregoing apparatus receives a plurality of semiconductor wafers W contained in a wafer cassette 10 one after another, wherein the semiconductor wafers W have not been subjected to film formation, and unloads the semiconductor wafers W processed by film formation into another wafer cassette 20 for recovery of the processed semiconductor wafers W. The wafer cassettes 10 and 20 are placed at different positions on a movement path of a wafer suction part 12.

The first transport part 1 includes a transport arm 11 and an arm driving part 13. The wafer suction part 12 is at one end of the transport arm 11, while a rotation axis RJ is provided at the other end of the transport arm 11 in order to rotate the transport arm 11 in a horizontal direction around the rotation axis RJ. The transport arm 11 makes a suction face VS of the wafer suction part 12 suction the semiconductor wafer W in accordance with an wafer suction command signal supplied from the control part 5. The transport arm 11 stops suction in accordance with a wafer suction stop command signal supplied from the control part 5, thus enabling separation of the semiconductor wafer W from the wafer suction part 12. The arm driving part 13 rotates the transport arm 11 in a horizontal direction in accordance with an arm rotation signal supplied from the control part 5. In addition, the arm driving part 13 vertically moves the transport arm 11 up and down in accordance with an arm up-down signal supplied from the control part 5.

The second transport part 2 includes a wafer waiting stage 21 and a stage up-down driving part 22. The wafer waiting stage 21 has a support part 21a for supporting the semiconductor wafer W while carrying the same in a horizontal state. The stage up-down driving part 22 vertically moves the wafer waiting stage 21 up and down in accordance with a stage up-down signal supplied from the control part 5.

The third transport part 3 comprises a heater carriage 33 including a susceptor 31 and a vacuum pump 32, and a slider device 34. The susceptor 31 has a built-in heater (not shown) operated by a power supply and the heater heats the susceptor, as shown in FIG. 1, so as to elevate a temperature of a susceptor surface SF to a desired level (for example, 400° C.) and enables maintenance of the same temperature. The susceptor 31 has a plurality of suction holes VB for vacuum suctioning the semiconductor wafer W. The vacuum pump 32 inhales air near the susceptor surface SF via the suction holes VB of the susceptor 31 in accordance with a wafer holding command signal supplied from the control part 5. The slider device 34 moves the heater carriage 33 right and left in a horizontal direction in cooperation with the susceptor 31 in accordance with a susceptor moving command signal supplied from the control part 5.

A gas inlet 41 is formed on a top of the dispersion head 4. A film forming gas from a supply source of the film forming gas, which contains a raw material for film formation (not shown), flows out of the gas inlet 41 and is inhaled upward. The dispersion head 4 has an outlet 42 which is placed around the gas inlet 41 so as to exhaust the treated gas. The dispersion head 4 is positioned on a movement path of the heater carriage 33 by the slider device 34, as shown in FIG. 1.

Figure 2:
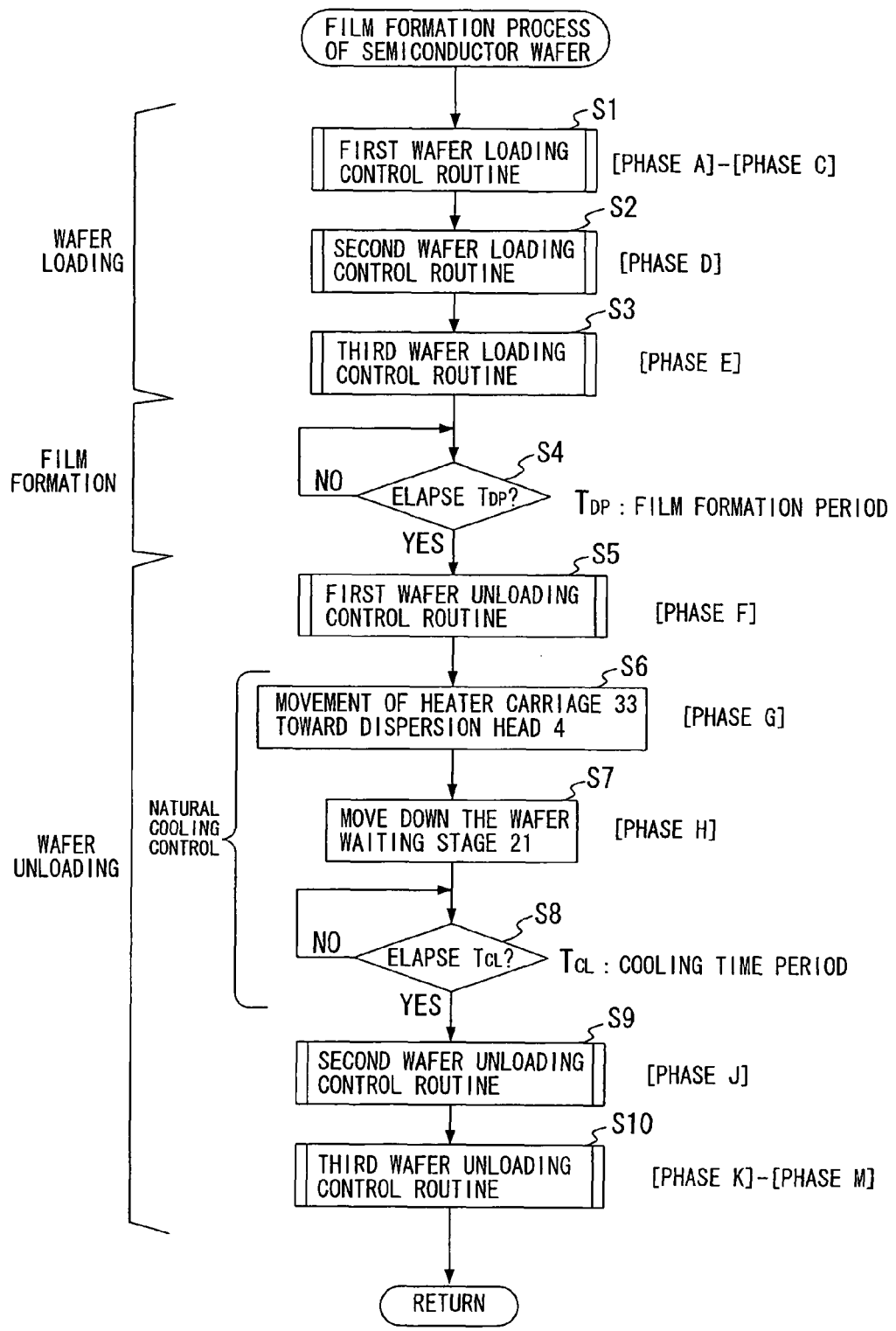
FIG. 2 is a flow diagram illustrating a film formation process of a semiconductor wafer conducted in a control part 5 shown in FIG. 1.
Figure 3:
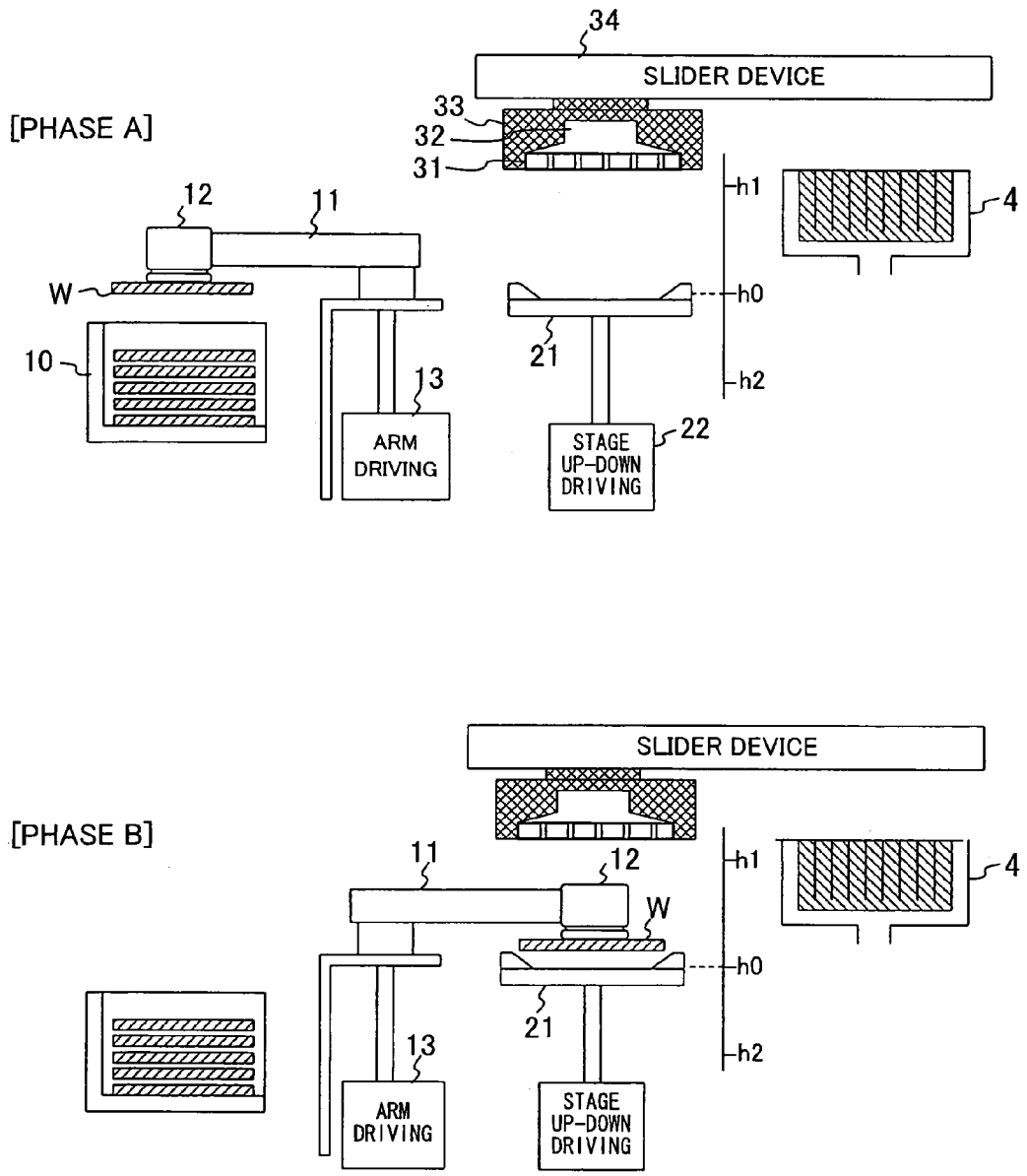
FIG. 3 illustrates separate phases in operation of the semiconductor manufacturing apparatus shown in FIG. 1.
Figure 4:
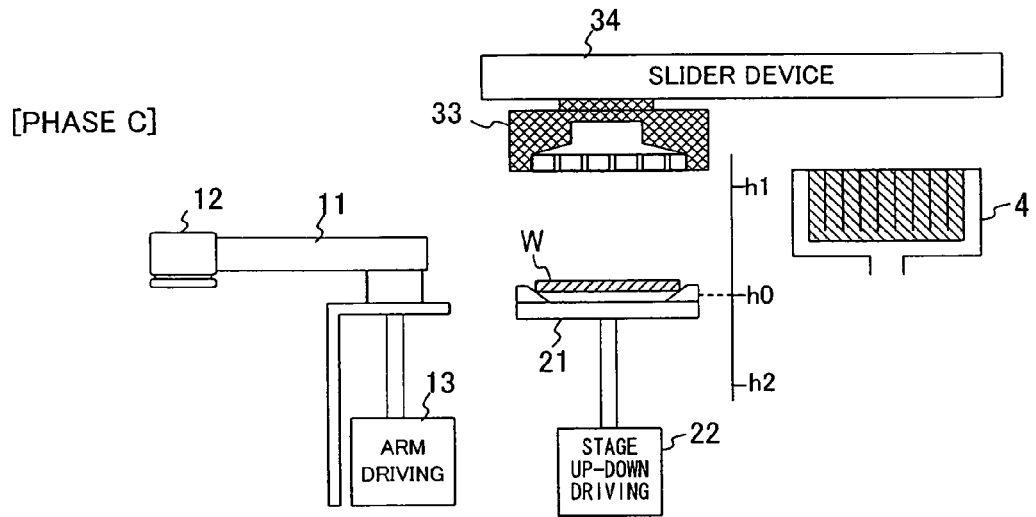
FIG. 4 illustrates separate phases in operation of the semiconductor manufacturing apparatus shown in FIG. 1.
Figure 4:
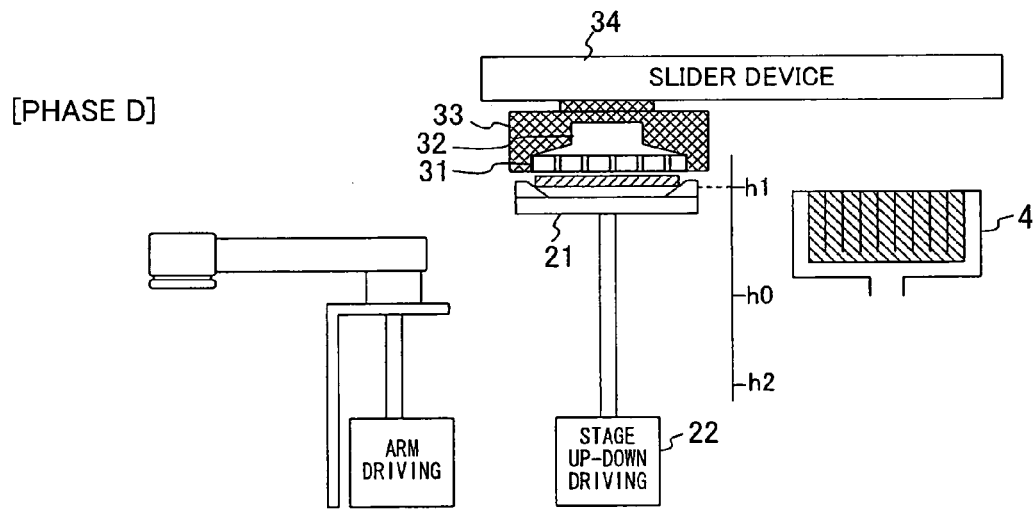

According to a flow diagram of a film formation process for a semiconductor wafer shown in FIG. 2, the control part 5 controls separate operations of the inventive semiconductor manufacturing apparatus. The flow diagram of the film formation process for a semiconductor wafer shown in FIG. 2 illustrates a sequential control order for a series of operations to treat each semiconductor wafer (wafer loading, film formation, wafer unloading).

The following description will be given of control operations and/or behaviors executed according to the foregoing flow diagram in conjunction with FIGS. 3 to 8. More particularly, each of FIGS. 3 to 8 shows a position of a module shown in FIG. 1 (except for a control part 5) at each step of a series of operations to treat a semiconductor wafer.

Referring to FIG. 2, a control part 5 executes a first wafer loading control routine (Step S1). In the first wafer loading control routine, the control part 5 rotates a transport arm 11 in a horizontal direction until a wafer suction part 12 of the first transport part 1 reaches a position of a wafer cassette 10. After rotating the transport arm 11 toward the above position, the control part 5 initiates a suctioning operation of the wafer suction part 12 which in turn enables the semiconductor wafer W contained in the wafer cassette 10 to be held to the wafer suction part 12, as shown in 'Phase A' of FIG. 3. Next, the control part 5 rotates the transport arm 11 in a horizontal direction until the wafer suction part 12 reaches a desired position above a wafer waiting stage 21 of a second transport part 2, as shown in 'Phase B' of FIG. 3. In this process, the wafer waiting stage 21 is fixed at an initial height h0, as shown in Phase B of FIG. 3. Here, when the wafer suction part 12 reaches the desired position above the wafer waiting stage 21, the control part 5 operates the transport arm 11 to stop wafer suction. According to the above process, the semiconductor wafer W held to the wafer suction part 12 of the transport arm 11 is separated from the wafer suction part 12 and placed on the wafer waiting stage 21. Then, the control part 5 rotates the transport arm 11 until the wafer suction part 12 reaches a position at which an upward movement of the wafer waiting stage 21 is not interrupted, as shown in 'Phase C' of FIG. 4.

According to the first wafer loading control routine executed in Step S1, the first transport part 1 transports the semiconductor wafer W contained in the wafer cassette 10 onto the wafer waiting stage 21 of the second transport part 2.

Next, the control part 5 executes a second wafer loading control routine (Step S2). In the second wafer loading control routine, the control part 5 lifts the wafer waiting stage 21 as well as the semiconductor wafer W upward to a height h1, as shown in 'Phase D' of FIG. 4.

According to the second wafer loading control routine in the foregoing Step S2, the second transport part 2 transports the semiconductor wafer W to a position of the height h1 near to a susceptor 31 of a third transport part 3.

Following this, the control part 3 executes a third wafer loading control routine (Step S3). In the third wafer loading control routine, the control part 5 firstly enables inhalation of air around a susceptor surface SF via suction holes VB of the susceptor 31 by a vacuum pump 32 mounted on a heater carriage 33. As a result, the control part 5 may maintain the semiconductor wafer W supported by the wafer waiting stage 21 on the susceptor surface SF of the susceptor 31. Then, the control part 5 moves the heater carriage 33 in a horizontal direction to a position at which a surface of the semiconductor wafer W thoroughly overlaps with a gas inlet 41 of a dispersion head 4, while maintaining the semiconductor wafer W on the susceptor surface SF, as shown in 'Phase E' of FIG. 5.

According to the third wafer loading control routine in the foregoing Step S3, the third transport part 3 transports the semiconductor wafer W to the dispersion head 4.

Figure 5:
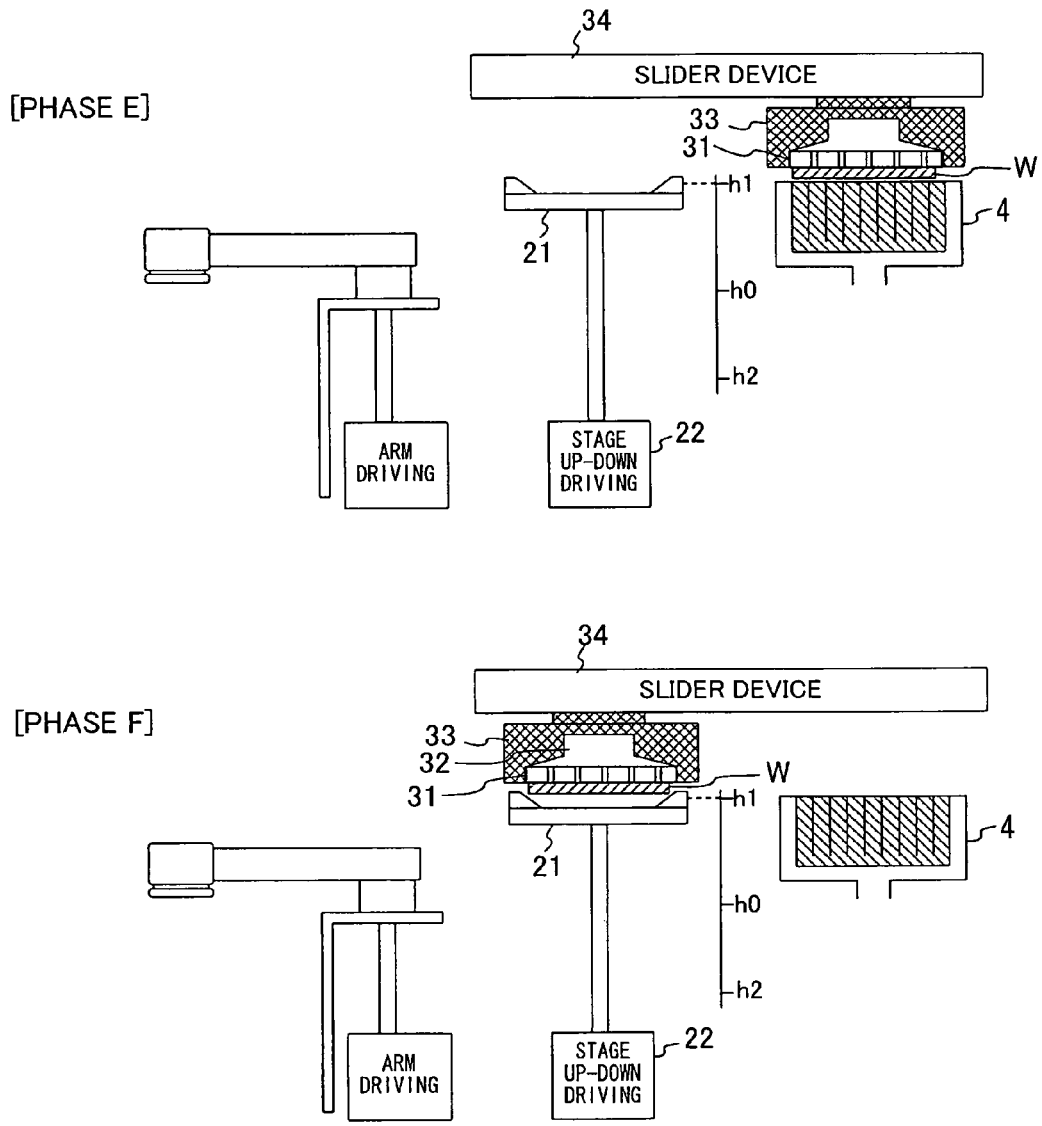
FIG. 5 illustrates separate phases in operation of the semiconductor manufacturing apparatus shown in FIG. 1.

Subsequently, the control part 5 repeatedly determines whether a desired period of time for a film formation period $T_{DP}$ has elapsed or not, after moving the heater carriage 33 to a position shown in Phase E of FIG. 5, until a result of the determination is 'yes', that is, until it is determined that the film formation period $T_{DP}$ has elapsed (Step S4). According to Step S4, a film forming gas discharged from the gas inlet 31 of the dispersion head 4 during the film formation period $T_{DP}$ may blow over a surface of the semiconductor wafer W heated using the susceptor 31. As a result, a desired thin film is formed on the surface of the semiconductor wafer W.

With respect to Step S4, if it is determined that the film formation period $T_{DP}$ has elapsed, that is, if the surface of the semiconductor wafer W is covered with the thin film, the control part 5 executes a first wafer unloading control routine (Step S5). In the first wafer unloading control routine, the control part 5 firstly moves the heater carriage 33 in a horizontal direction, as shown in 'Phase F' of FIG. 5, until the semiconductor wafer W reaches a desired position above the wafer waiting stage 21 of the second transport part 2. Then, the control part 5 stops the suctioning operation of the vacuum pump 32 mounted on the heater carriage 33. As a result, the semiconductor wafer W held by the susceptor 31 is separated from the same and placed on the wafer waiting stage 21.

According to the first wafer unloading control routine in the foregoing Step S5, the third transport part 3 transports the semiconductor wafer W onto the wafer waiting stage 21 of the second transport part 2.

Next, the control part 5 executes a wafer cooling control routine according to the following Steps S6 to S8. More particularly, as shown in 'Phase G' of FIG. 6, the control part 5 firstly moves the heater carriage 33 in a horizontal direction to a position above the dispersion head 4 (Step S6). Next, the control part 5 moves the wafer waiting stage 21 carrying the semiconductor wafer W downward to a height h2 lower than the initial height h0 described above (Step S7). After completion of Steps S6 and S7, the control part 5 makes a determination as to whether a desired cooling time period $T_{CL}$ from the point in time immediately after completion of Steps S6 and S7 has elapsed or not (Step S8). In other words, the semiconductor wafer W is naturally cooled on the wafer waiting stage 21 during the cooling time period $T_{CL}$.

Figure 6:
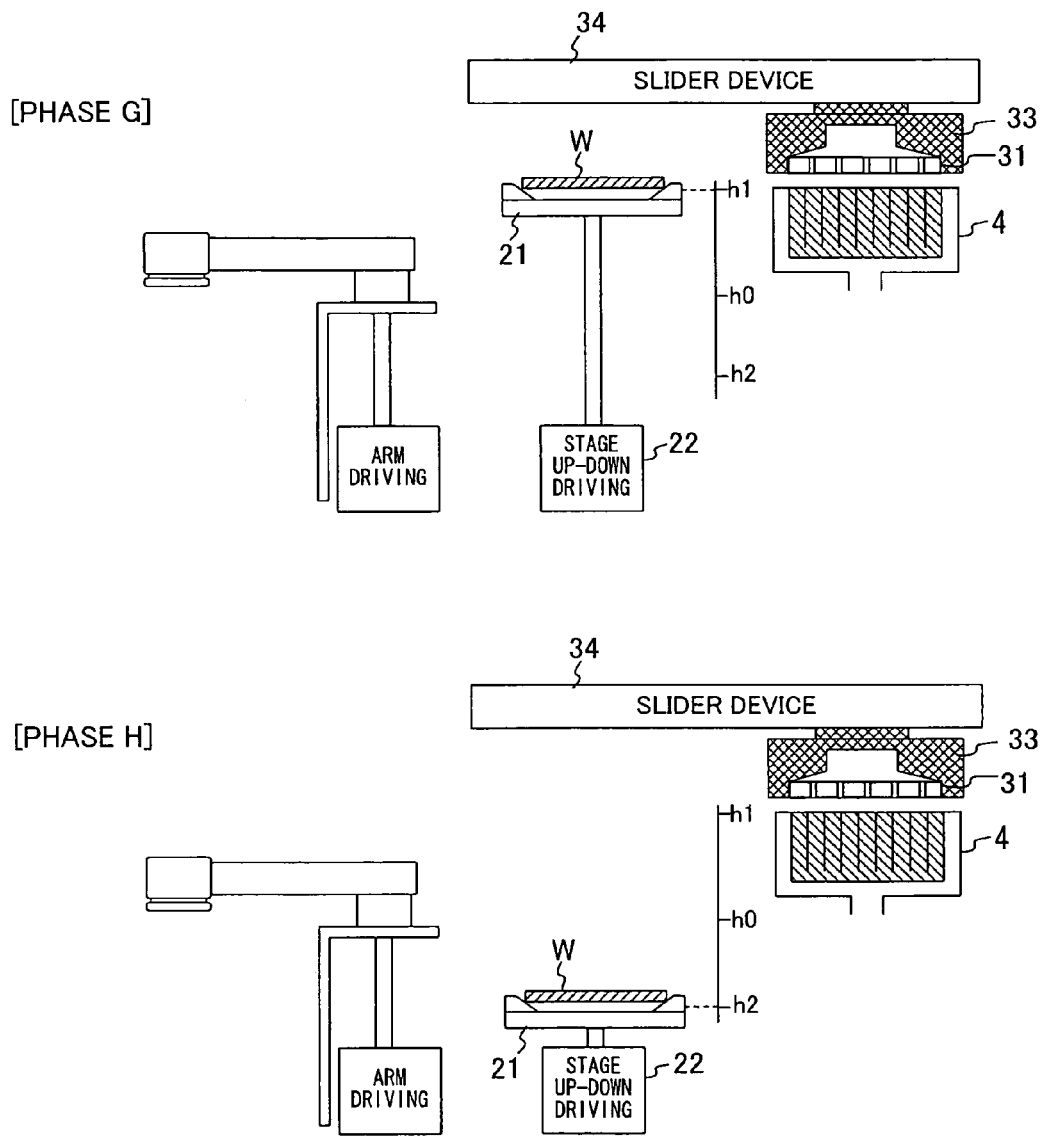
FIG. 6 illustrates separate phases in operation of the semiconductor manufacturing apparatus shown in FIG. 1.
Figure 7:
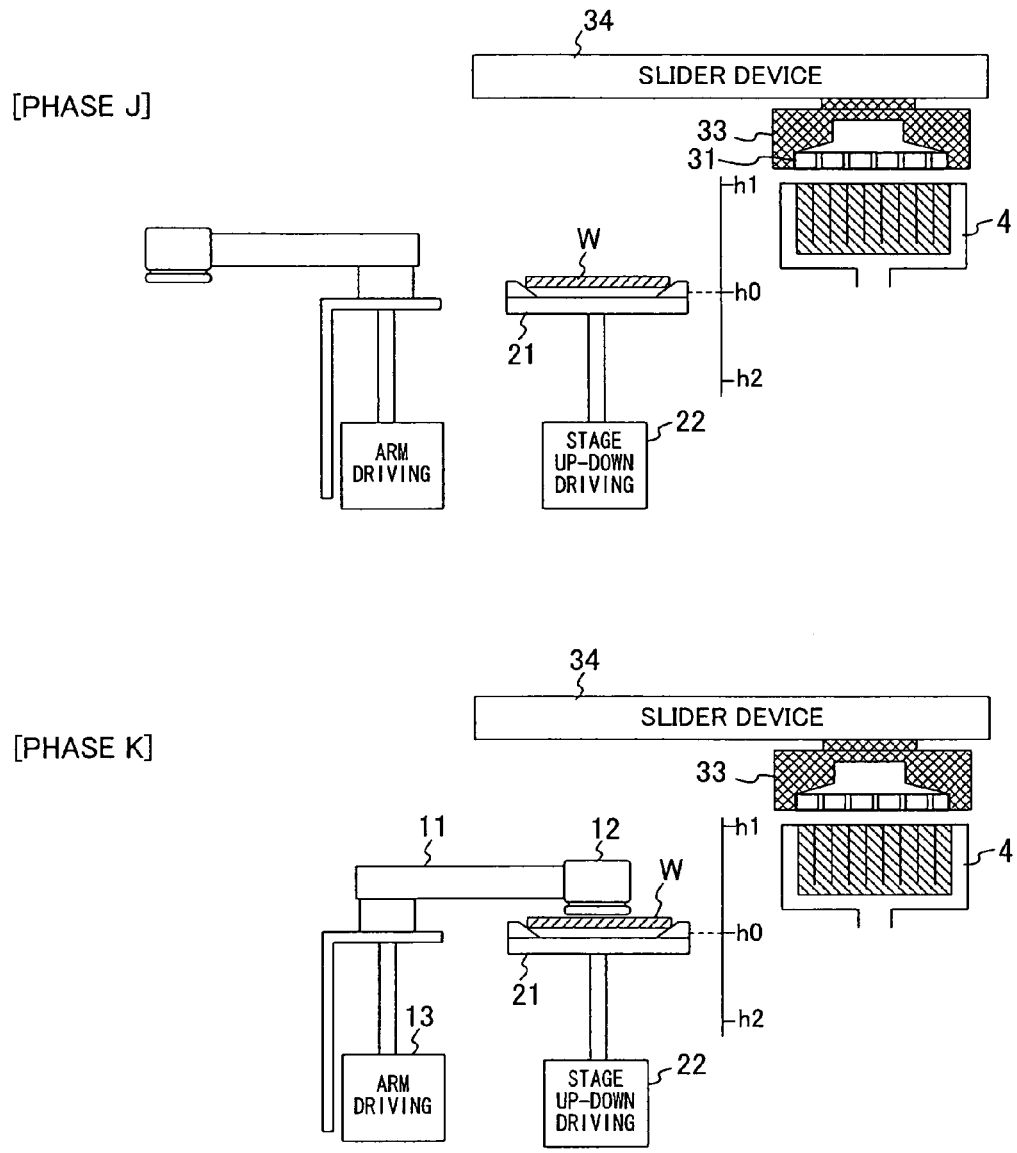
FIG. 7 illustrates separate phases in operation of the semiconductor manufacturing apparatus shown in FIG. 1.
Figure 8:
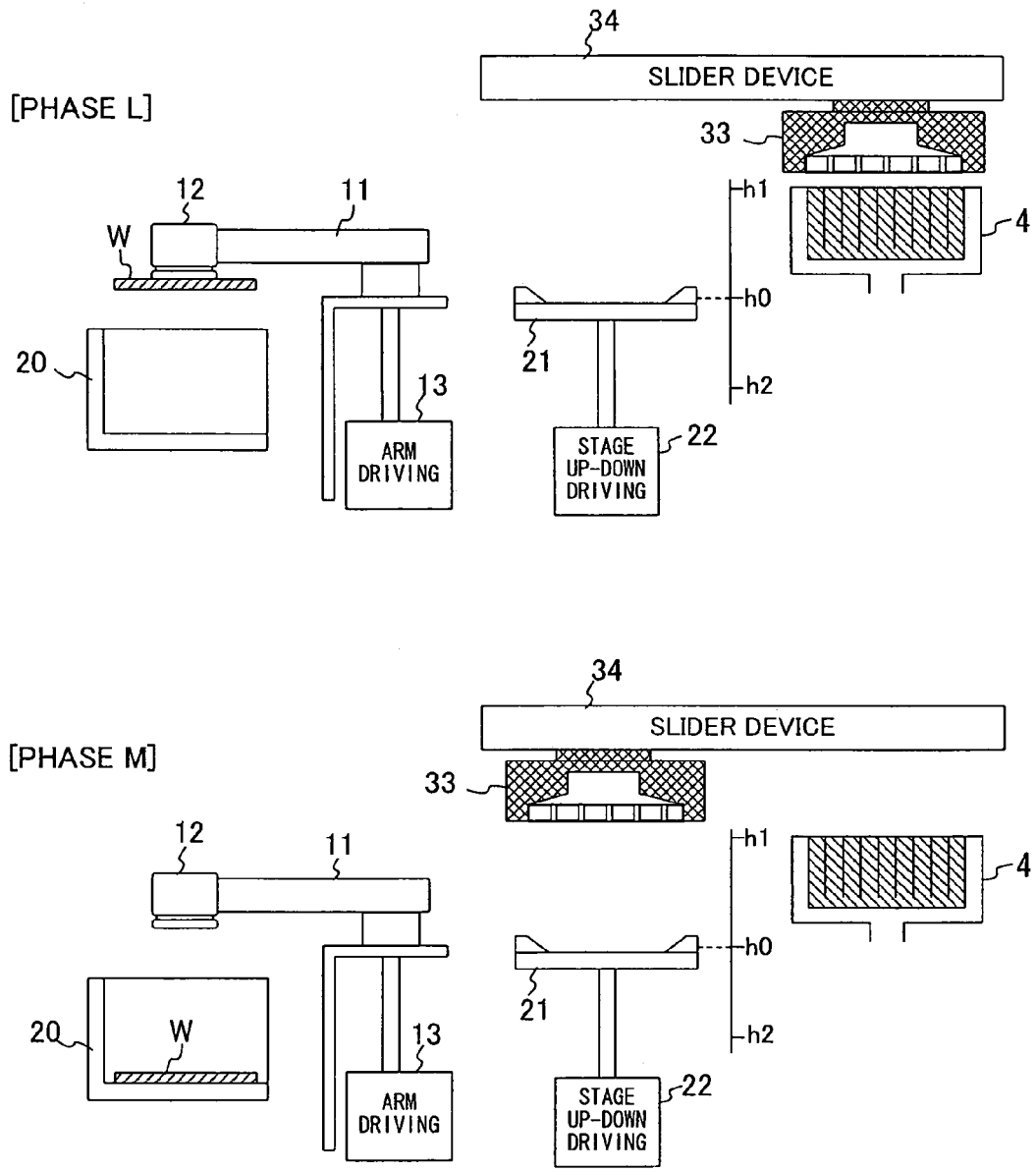
FIG. 8 illustrates separate phases in operation of the semiconductor manufacturing apparatus shown in FIG. 1.

With respect to the wafer cooling control routine in Steps S6 to S8, during the semiconductor wafer W at a high temperature after film formation is naturally cooled, the heater carriage 33 stays on the dispersion head 4, as shown in Phase G of FIG. 6, so as to prevent the heated susceptor 31 from being positioned above the semiconductor wafer W. Accordingly, since an amount of radiant heat directly irradiating the semiconductor wafer W emitted from the suspector surface SF of the susceptor 31 is decreased, it is possible to reduce the cooling time period $T_{CL}$, compared to a cooling process without the foregoing configuration. Also, when the semiconductor wafer W is naturally cooled, the semiconductor wafer W is located apart from the susceptor 31 serving as a heater by moving the wafer waiting stage 21 downward, as shown in 'Phase H' of FIG. 6, wherein the wafer waiting stage carries the semiconductor wafer W. Therefore, the cooling time period $T_{CL}$ may be further reduced.

After the wafer cooling control routine in Steps S6 to S8, the control part 5 executes a second wafer unloading control routine (Step S9). In the second wafer unloading control routine, the control part 5 moves the wafer waiting stage 21 as well as the semiconductor wafer W upward to reach the initial height h0, as shown in 'Phase J' of FIG. 7.

According to the second wafer unloading control routine in Step S9, the second transport part 2 transports the semiconductor wafer W to the height h0 at which the wafer is delivered to the first transport part 1.

Subsequently, the control part 5 executes a third wafer unloading control routine (Step S10). In the third wafer unloading control routine, the control part 5 firstly rotates the transport arm 11 in a horizontal direction, as shown in 'Phase K' of FIG. 7, until the wafer suction part 12 reaches a position of the semiconductor wafer W supported by the wafer waiting stage 21. When the transport arm 11 is rotating to the above described position, the control part 5 initiates the suctioning operation of the transport arm 11 so as to hold the semiconductor wafer W supported by the wafer waiting stage 21 to the wafer suction part 12. Then, the control part 5 rotates the transport arm 11 in a horizontal direction, as shown in 'Phase L' of FIG. 8, until the wafer suction part 12 reaches a position above the wafer cassette 20 to contain the semiconductor wafer W processed by film formation. The control part 5 stops the suctioning operation of the transport arm 11 that suctions the semiconductor wafer W. Accordingly, the semiconductor wafer W adsorbed to the wafer suction part 12 of the transport arm 11 is separated and unloaded into the wafer cassette 20, as shown in 'Phase M' of FIG. 8. As shown in Phase M of FIG. 8, the control part 5 moves the heater carriage 33 in a horizontal direction to a position above the wafer waiting stage 21, thus subjecting the semiconductor wafer W to further processing.

As described above, with respect to the semiconductor manufacturing apparatus shown in FIG. 1, the susceptor 31 for heating the semiconductor wafer W processed by film formation is moved to a position of the dispersion head 4 in which film formation is conducted, while holding the semiconductor wafer W on the susceptor surface SF (Phases D and E). If a thin film was formed on a surface of the semiconductor wafer W by the dispersion head 4, the susceptor 31 holding the semiconductor wafer W is moved to a position above the wafer waiting stage 21 (Phase F). Then, by stopping the holding operation of the susceptor 31, the semiconductor wafer W is separated therefrom and is in turn positioned on the wafer waiting stage 21. Continuously, the susceptor 31 present above the semiconductor wafer W (Phase F), which serves as a heater, is moved in a horizontal direction (Phase G). At the same time, the wafer waiting stage 21 is moved downward in order to keep the semiconductor wafer W apart from the susceptor 31 and this condition is maintained for a desired cooling time period $T_{CL}$ (Step S8). As a result, the semiconductor wafer W is naturally cooled. Afterward, the semiconductor wafer W placed on the wafer waiting stage 21 is adsorbed to the transport arm 11 (Phase K), followed by rotating the transport arm 11 so that the semiconductor wafer W is transported into the wafer cassette 20 from which the semiconductor wafer W processed by film formation is contained (Phase L).

As such, with respect to transportation of a semiconductor wafer processed by film formation into a wafer cassette while being adsorbed to a transport arm according to the foregoing embodiment of the present invention, the semiconductor wafer in a hot state obtained just after film formation is firstly naturally cooled then subjected to a suctioning process. Therefore, adsorption failure caused by thermal deformation of the semiconductor wafer may be inhibited, thus ensuring smooth transportation thereof. As for natural cooling of the semiconductor wafer, since a susceptor serving as a heater located above the semiconductor is moved in a horizontal direction, an amount of radiant heat emitted from a surface of the susceptor directly irradiating the semiconductor wafer is decreased, thus appropriately reducing a natural cooling time. In addition, the semiconductor wafer is lifted down in order to keep the same apart from the susceptor serving as a heater during natural cooling, thereby further reducing the natural cooling time.

Moreover, although the foregoing embodiment of the present invention describes operation of an atmospheric pressure CVD apparatus as a semiconductor manufacturing apparatus, the present invention may also be applied to other equipment for manufacturing semiconductors other than the atmospheric pressure CVD apparatus.

Briefly, the present invention relates to a semiconductor manufacturing apparatus characterized in that a semiconductor wafer is subjected to several processes (desired processes) while heating the same using a heater and the processed semiconductor wafer is adsorbed to a transport arm and transported outside, thereby accomplishing advantageous effects described above.

Figure 9:
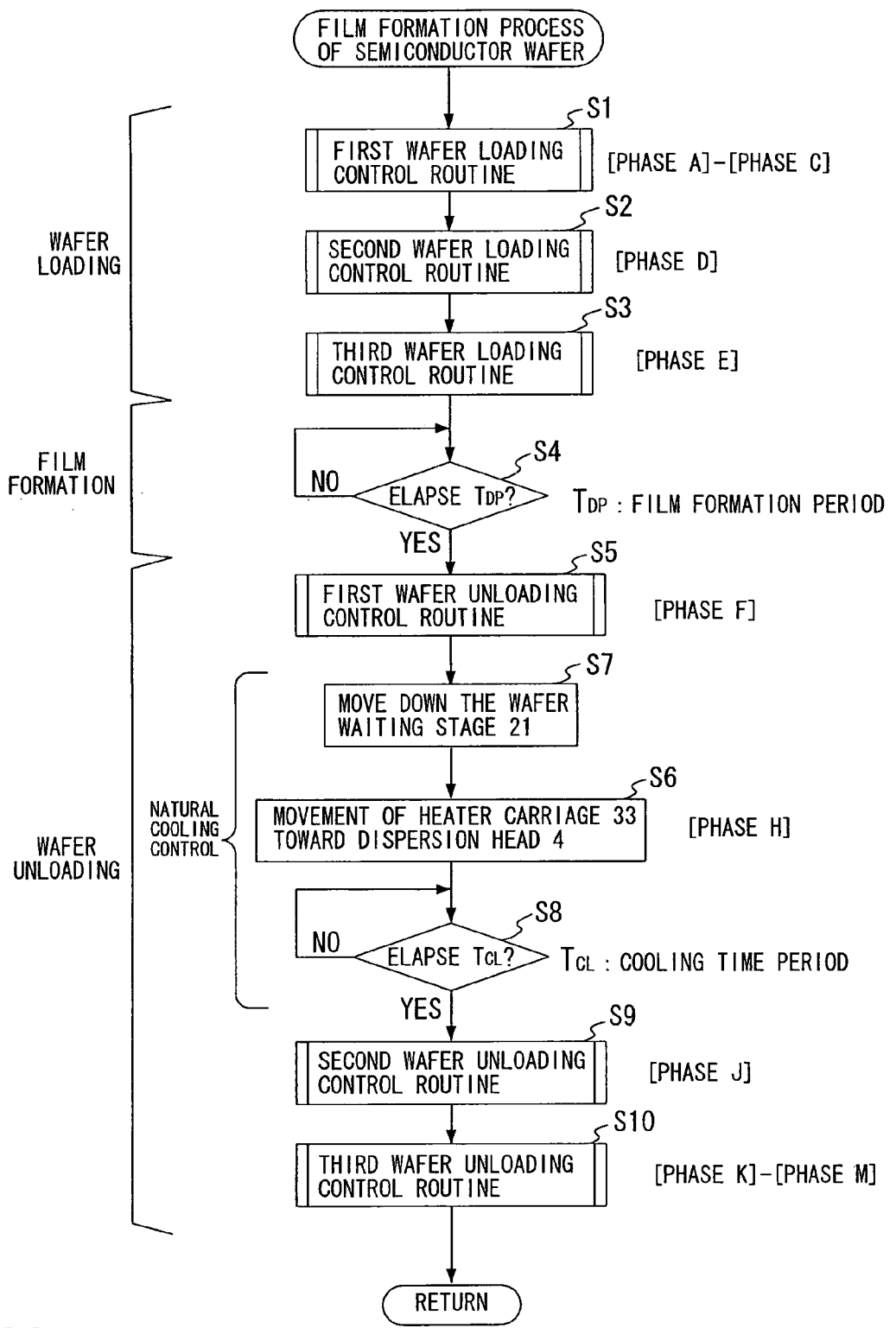
FIG. 9 is a modified flow diagram illustrating the film formation process of a semiconductor wafer shown in FIG. 2.

Furthermore, referring to FIG. 2 which is a flow diagram of a film formation process of a semiconductor wafer, after moving a heater carriage as a natural cooling control device in a horizontal direction (Step S6), a wafer waiting stage 21 is moved downward (Step S7). However, these processes may be conducted in reverse order. That is, after Step S5, the wafer waiting stage 21 is firstly moved downward (Step S7), and then, the heater carriage 33 is moved in a horizontal direction (Step S6), as shown in FIG. 9. In addition, FIG. 9 shows that operations in Steps S1 to S5 and Steps S8 to S10 and a sequential order thereof are substantially identical to those shown in FIG. 2.

Alternatively, operations in Steps S6 and S7 may be simultaneously conducted. That is, while moving the heater carriage 31 in a horizontal direction, the wafer waiting stage 21 may be moved downward.

What is claimed is:

1. A semiconductor manufacturing method for holding a semiconductor wafer by suction inside of a manufacturing apparatus and transporting said semiconductor wafer to outside of the manufacturing apparatus, said semiconductor wafer having been processed by a desired treatment during heating inside of the manufacturing apparatus, comprising:
    moving a susceptor to a first position above a wafer waiting stage after completing said desired treatment, wherein said susceptor heats said semiconductor wafer while holding said semiconductor wafer;
    separating said semiconductor wafer from said susceptor so as to allow said semiconductor wafer to move to said wafer waiting stage;
    moving said susceptor in a horizontal direction from said first position to a second position different from said first position; and
    holding said semiconductor wafer placed on said wafer waiting stage to a transport arm and transporting said semiconductor wafer outside of the manufacturing apparatus by said transport arm after a predetermined cooling period following an end of moving said susceptor in the horizontal direction; the method further including vertically moving said wafer waiting stage upward and downward.

2. The semiconductor manufacturing method according to claim 1, wherein moving said susceptor from said first position to said second position also includes moving said wafer waiting stage further downward.

3. The semiconductor manufacturing method according to claim 1, wherein said susceptor heats said semiconductor wafer by elevating a temperature of a surface of said susceptor that is in contact with said semiconductor wafer to a desired level.

4. The semiconductor manufacturing method according to claim 1, wherein transporting by said transport arm includes rotating the transport arm in a horizontal direction.

5. The semiconductor manufacturing method according to claim 1, wherein said desired treatment is conducted at the second position.

6. The semiconductor manufacturing method according to claim 5, wherein said desired treatment includes forming a thin film on a surface of said semiconductor wafer.

7. The semiconductor manufacturing method according to claim 5, wherein said desired treatment includes discharging a film forming gas from a dispersion head over a surface of said semiconductor wafer.

8. The semiconductor manufacturing method according to claim 6, further including naturally cooling said semiconductor wafer after forming the thin film on the surface of said semiconductor wafer.

* * * * *